(12) United States Patent
Nakada et al.

(10) Patent No.: US 6,341,053 B1
(45) Date of Patent: Jan. 22, 2002

(54) MAGNETIC TUNNEL JUNCTION ELEMENTS AND THEIR FABRICATION METHOD

(75) Inventors: Masafumi Nakada; Hisanao Tsuge; Yuji Tsukamoto; Hisao Matsutera; Nobuyuki Ishiwata; Atsushi Kamijo, all of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/182,671

(22) Filed: Oct. 30, 1998

(30) Foreign Application Priority Data

Oct. 30, 1997 (JP) .............................. 9-298567

(51) Int. Cl.[7] ................................ G11B 5/39
(52) U.S. Cl. ................................. 360/324.2
(58) Field of Search .............. 360/324.2, 324.11; 324/252, 207.21; 338/32 R

(56) References Cited

U.S. PATENT DOCUMENTS

| | | | |
|---|---|---|---|
| 5,315,282 A | 5/1994 | Shinjo et al. | 338/32 R |
| 5,390,061 A * | 2/1995 | Nakatani et al. | 360/324.2 |
| 5,650,958 A | 7/1997 | Gallagher et al. | 365/173 |
| 5,729,410 A | 3/1998 | Fontana, Jr. et al. | 360/113 |
| 5,764,567 A | 6/1998 | Parkin | 365/173 |
| 5,768,069 A * | 6/1998 | Mauri | 360/314 |
| 5,780,176 A * | 7/1998 | Iwasaki et al. | 360/324.11 X |
| 5,801,984 A | 9/1998 | Parkin | 365/158 |

FOREIGN PATENT DOCUMENTS

| | | |
|---|---|---|
| JP | 5-63254 | 3/1993 |
| JP | 6-244477 | 9/1994 |
| JP | 8-70148 | 3/1996 |
| JP | 8-70149 | 3/1996 |
| JP | 8-316548 | 11/1996 |
| JP | 9-186374 | 7/1997 |

OTHER PUBLICATIONS

W.J. Gallagher et al., "Microstructed magnetic tunnel junctions", Journal of Applied Physics 81, Apr. 15, 1997, pp. 3741–3746.

N. Tezuka et al., "Relationship between the Barrier and Magnetoresistance Effect in Ferromagnetic Tunneling Junctions", Journal of Japanese Applied Magnetism Society, vol. 21, No. 4–2, 1997, pp. 493–496.

Mao et al, "NiMn–pinned spin valves with high pinning field made by ion beam sputtering", Dec. 1996.*

Appl. Phys. Lett 69 (23), pp. 3593–3595.*

* cited by examiner

*Primary Examiner*—David L. Ometz
(74) *Attorney, Agent, or Firm*—Sughrue, Mion, Zinn, Macpeak & Seas, PLLC

(57) ABSTRACT

The present invention provides a magnetic tunnel junction device for an external magnetic field sensor. The device comprises a stack of multi-layers, which include a first antiferromagnetic pinning layer, a ferromagnetic free layer, a tunneling barrier layer, a ferromagnetic pinned layer, and a second antiferromagnetic pinning layer. The first pinning layer has a first pinning field, which pins a magnetization of the free layer in a track width direction. The second pinning layer has a second pinning field, which pins a magnetization of the pinned layer in a direction in the plane of the stacked layers of the magnetic tunnel junction, along the applied external magnetic field direction.

13 Claims, 4 Drawing Sheets

MAGNETIC TUNNEL JUNCTION ELEMENTS AND THEIR FABRICATION METHOD

FIELD OF THE INVENTION

The present invention relates to a magnetic tunnel junction device usable as a playback magnetic head of a high density magnetic disc device or a memory cell of a magnetic random access memory (MRAM) or an external magnetic field sensor.

BACKGROUND OF THE INVENTION

A magnetic tunnel junction device has a tunnel magnetoresistance response as a function of applied magnetic field. Each magnetic tunnel junction in the device is formed of a ferromagnetic pinned layer, a ferromagnetic free layer, and an insulating tunnel barrier between and in contact with the two ferromagnetic layers. Magnetization direction of the ferromagnetic pinned layer is prevented from rotating, while magnetization of the ferromagnetic free layer is free to rotate between states parallel and antiparallel to the fixed magnetization of the ferromagnetic pinned layer. In the parallel state, the tunneling current is at a maximum and the tunneling resistance at a minimum. On the other hand, in the antiparallel state, the tunneling current is at a minimum and the tunneling resistance is at a maximum. The direction of the magnetization can be altered by an external magnetic field. Thus, the tunneling resistance is sensitive to magnetic field.

In "Microstructured Magnetic Tunnel Junctions", Journal of Applied Physics 81 (8), Apr. 15, 1997, pp. 3741–3746, Gallagher, et al. reported on magnetic tunnel junctions using a tunneling barrier formed by plasma oxidizing an Al layer, which demonstrated large magnetoresistance (MR) ratios (15% to 22%) at room temperatures in low field. They reported on processes used to make magnetic tunnel junction devices with dimensions on the micron-to-submicron scale. For achieving two stable states in zero magnetic field, they employed an antiferromagnetic layer to exchange bias one of the electrode layers. This electrode layer is referred to as the pinned layer. The other electrode layer is referred to as the free layer.

FIG. 5 illustrates, a typical example of a magnetic tunnel junction having a tunneling barrier formed by oxidizing an Al layer, which provides a maximum MR ratio of 21%. In FIG. 5, the magnetic tunnel junction is on a substrate 54 of silicon (Si) and is formed of a series of layers of material stacked one on top of the other. The magnetic tunnel junction, in this example, comprises a bottom electrode 55 of platinum (Pt) (20 nm thick), an initial ferromagnetic layer 56 of a nickel-iron (Ni—Fe) alloy (4 nm thick), an antiferromagnetic layer 57 of an iron-manganese (Fe—Mn) alloy (10 nm), a fixed or ferromagnetic pinned layer 58 of Ni—Fe (8 nm thick), a tunneling barrier layer 59 of aluminum oxide ($Al_2O_3$) formed by exposing a surface of an aluminum layer with 1.0 to 3.0 nm thick to an oxygen glow discharge, a ferromagnetic free layer 60 of cobalt (Co) (8 nm thick), and a top electrode of Pt (20 nm thick).

Magnetic tunnel devices including a tunneling barrier layer of $Al_2O_3$ formed by exposing a surface of an aluminum layer to the ambient atmosphere are described in JP-A 6-244477, JP-A 5-63254, JP-A 8-70148, JP-A 8-70149 and JP-A 8-316548. Which are laid-open publications of Japanese Patent Applications relating to inventions by T. Miyazaki and M. Etsumura.

In "Relationship between the Barrier and Magnetoresistance Effect in Ferromagnetic Tunneling Junctions",Journal of Japanese Applied Magnetism Society, Vol. 21, No. 4-2, 1977, pp. 493–496, N. Tesuka et al. reported on Fe/Al oxide/Fe junctions under varying oxidation conditions of the Al layer.

Fabrication of magnetic tunnel junctions at sizes below several microns is needed for their application to a playback magnetic head of a high-density magnetic disc device or a memory cell of a high density MRAM. In this case, the magnetic domain instabilities taking place in magnetic layers after a magnetic field has been applied cause a smaller signal to noise ratio. There remains a need, therefore, to fabricate magnetic tunnel junctions at sizes below several microns, which provide a larger signal to noise ratio in a magnetic field.

An object of the present invention is to accomplish the above-mentioned need.

SUMMARY OF THE INVENTION

A magnetic tunnel junction device according to one implementation of the present invention comprises a first pinning layer, a ferromagnetic free layer, a tunneling barrier layer, a ferromagnetic pinned layer, and a second pinning layer, which are stacked one on top of the other in this order. The first and second pinning layers may be in the form of antiferromagnetic layers, respectively. The ferromagnetic free layer is adjacent to the first pinning layer. Exchange coupling between the ferromagnetic free layer and the first pinning layer develops a magnetic anisotropy, which aligns magnetization of the ferromagnetic free layer along a track width direction. In other words, the first pinning layer has a pinning field, which pins a magnetization of the free layer in the track width direction. Exchange coupling between the ferromagnetic pinned layer and the second pinning layer develops a magnetic anisotropy, which aligns magnetization of the ferromagnetic pinned layer along a MR height direction. In other words, the second pinning layer has a pinning field, which pins a magnetization of the pinned layer In the MR height direction.

In the present application, a direction, in the plane of stalked layers of a magnetic tunnel junction, along the applied external magnetic field direction is called a MR height direction. A traverse direction, in another plane of the layers, forming right angles to the applied external magnetic field direction is called a track width direction.

A process of fabricating a magnetic tunnel junction comprises the step of forming a series of layers one on top of the others, the series of layers including a first antiferromagnetic pinning layer, a ferromagnetic free layer, a tunneling barrier layer, a ferromagnetic pinned layer, and a second antiferromagnetic pinning layer. The process also comprises the step of heating the layers at a temperature higher than a blocking temperature $T_{B2}$ of the material of the second antiferromagnetic pinning layer in a magnetic field directed parallel to a MR height direction. The process further comprises the step of heating the layers at a temperature higher than a blocking temperature $T_{B1}$ of the material of the first antiferromagnetic pinning layer in a magnetic field directed parallel to a track width direction.

It is required for suppressing noise upon sensing an external magnetic field to continuously vary the direction of magnetization in a ferromagnetic free layer of a magnetic tunnel junction after application of the field. For accomplishing this continuous variation, it is effective to develop a unidirectional magnetic domain, in the free layer, having a magnetic anisotropy, which aligns magnetization of the free layer along a track width direction that form right angles to the applied external magnetic field direction. There is a relation between noise and the magnetization direction of the free layer, which direction rotates upon application of external magnetic field. If the magnetization of the free layer is aligned in a MR height direction that is parallel to the applied external field direction, variation in the direction of magnetization due to the applied external field is in discontinuous magnetic domain displacement mode, thus providing a magnetoresistance (MR) curve with hysteresis. In the case where the magnetization of the free layer is aligned in the track width height direction, variation in the direction of magnetization due to the applied external field is in continuous magnetic domain rotation mode, thus providing a magnetoresistance (MR) curve without hysteresis.

According to one implementation of the present invention, therefore, the antiferromagnetic pinning layer is employed to exchange bias the free layer to induce a unidirectional magnetic anisotropy. The magnetic field induced due to the exchange coupling between the pinning layer and the free layer is larger in magnitude than the intrinsic magnetic anisotropy in the free layer. The magnetic anisotropy developed aligns magnetization in the free layer along the track width direction that forms right angles to the MR height direction. This configuration has demonstrated a large signal to noise ratio because, upon application of an external magnetic field along the MR direction, variation in direction of magnetization due to the applied field is in continuous magnetic domain rotation mode.

In order to rotate anisotropy in the free layer with anisotropy in the pinned layer unaltered for providing juxtaposed anisotropy relation, it is necessary to heat the free layer in magnetic field at a temperature lower than a temperature at which the pinned layer is heated by at least 50° C. The free layer and the first pinned layer are fabricated to have a blocking temperature $T_{B1}$ lower than the temperature for heating the first pinned layer by at least 50° C. The temperature for heating the free layer is set at a temperature immediately above the blocking temperature $T_{B1}$. Heating under this condition has proved to be effective in rotating anisotropy in the free layer to align magnetization along the track width direction while maintaining magnetization in the pinned layer, which has been aligned along the MR height direction.

The magnetic discs operate at temperatures around 100° C. If the magnetic tunnel junction is used for a magnetic disc, it is desired to set the blocking temperature $T_{B1}$ higher than 150° C. ($T_{B1}$>150° C.) for its operation stability.

The magnetic field Hex1 developed due to magnetic coupling with the first antiferromagnetic pinning layer needs to be sufficiently larger than the intrinsic magnetic anisotropy induced in the free layer. Thus, it is desired to set Hex1 larger than 20 Oe (oersted). That is, Hex1>20 Oe.

Management of the magnitude of magnetic field developed in the free layer due to magnetic coupling Is important because the magnitude of this field determines sensitivity of an external magnetic field sensor. Locating an interface layer of nonmagnetic metal between the first pinning layer and the free layer makes this management. According to another implementation of the present invention, a magnetic tunnel Junction device comprises a first pinning layer, an interface layer, a ferromagnetic free layer, a tunneling barrier layer, a ferromagnetic pinned layer, and a second pinning layer, which are stacked one on top of the other in this order. The first and second pinning layers may be in the form of antiferromagnetic layers, respectively. The ferromagnetic free layer is adjacent to the first pinning layer with the interface layer interposed between them. Exchange coupling between the ferromagnetic free layer and the first pinning layer develops a magnetic anisotropy, which aligns magnetization of the ferromagnetic free layer along a track width direction. In other words, the first pinning layer has a pinning field, which pins a magnetization of the free layer in the track width direction. Exchange coupling between the ferromagnetic pinned layer and the second pinning layer develops a magnetic anisotropy, which aligns magnetization of the ferromagnetic pinned layer along a MR height direction. In other words, the second pinning layer has a pinning field, which pins a magnetization of the pinned layer in the MR height direction.

Fabricating the interface layer to have a thickness t falling in a range, i.e., 1 nm≦t≦10 nm, has proved to be effective in developing magnetic field in the free layer with appropriate magnitude for the external field magnetic sensor.

The first pinning layer may be in the form of a biasing ferromagnetic layer instead of the antiferromagnetic layer. In this case, the process step of aligning magnetization in the free layer in the track width direction requires a magnetic field that surpasses coercive force in the biasing ferromagnetic layer in heating the layers.

DESCRIPTION OF THE PREFERRED EMBODIMENTS

Figure 1:
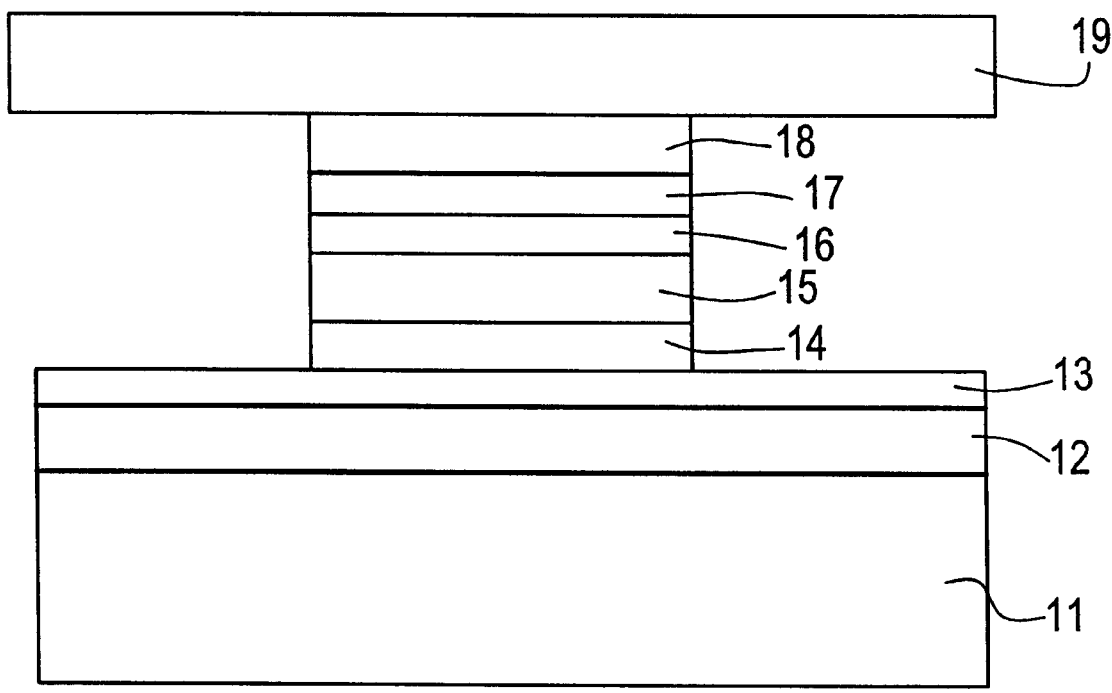
FIG. 1 a cross-section view of a magnetic tunnel junction device, according to the present invention, usable as an external magnetic field sensor.
Figure 1:
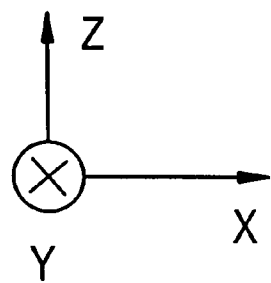

Referring to FIG. 1, the ferromagnetic tunnel junction device is formed on a substrate 11 and comprises a bottom electrode 12, an initializing or seed layer 13, a first antiferromagnetic pinning layer 14, a ferromagnetic free layer 15, a tunneling barrier layer 16, a ferromagnetic pinned layer 17, a second antiferromagnetic pinning layer 18, and a top electrode 19. The bottom electrode 12 is located on the substrate 11. A stack of layers 14, 15, 16, 17 and 18 is patterned and deposited on the initializing layer 13. The tunneling barrier layer 16 is sandwiched between the free and pinned layers 15 and 17. The top electrode is located on the second antiferromagnetic pinning layer 18.

In the magnetic tunnel junction device illustrated in FIG. 1, a track width direction is along X coordinate axis and a MR height direction is along Y coordinate axis. External magnetic field direction is along Y axis.

The initializing layer 13 is in the form of a single layer structure or a double layer structure. The material of each layer of the structure of the initializing layer 13 is selected from the group consisting of Al, Ti, V, Cr, Mn, Fe, Co, Ni, Cu, Zn, Y, Zr, Nb, Mo, Ru, Rh, Pd, Ag, Hf, Ta, W, Re, Pt, Au, Pb, and alloys of each of or a combination of these metals. For the double layer structure, metal/metal or metal/alloy or alloy/alloy may be employed.

Each of the first and second antiferromagnetic pinning layers 14 and 18 is in the form of a single layer structure or a double layer structure. The material of each layer of the structure of the pinning layers 14 and 18 is selected from the group consisting of a Fe—Mn alloy, a Ni—Mn alloy, a Pt—Mn alloy, an Ir—Mn alloy, a Ru—Mn alloy, a Rh—Mn alloy, and a Cr—Al alloy.

The material of the ferromagnetic free and pinned layers 15 and 17 is selected from the group consisting of alloys containing at least one of Fe, Co, and Ni. Examples of the alloys are NiFe, NiFeCo, CoZr, FeCoB, Sendust, iron nitride alloys, FeCo, and etc. The free and pinned layers 15 and 17 may be formed of the same material or different materials, respectively.

It is possible to obtain larger magnetoresistance (MR) ratio by depositing a thin film of Co or CoFe with about 1 nm thick on each of the ferromagnetic free and pinned layers 15 and 17 on its surface facing the adjacent nonmagnetic layer, The tunneling barrier layer 16 may be formed of oxidation film of a metal selected from the group consisting of Al, Mg, and lanthanoide series.

The material of the bottom and top electrodes 12 and 19 is Al or Pt.

Figure 2:
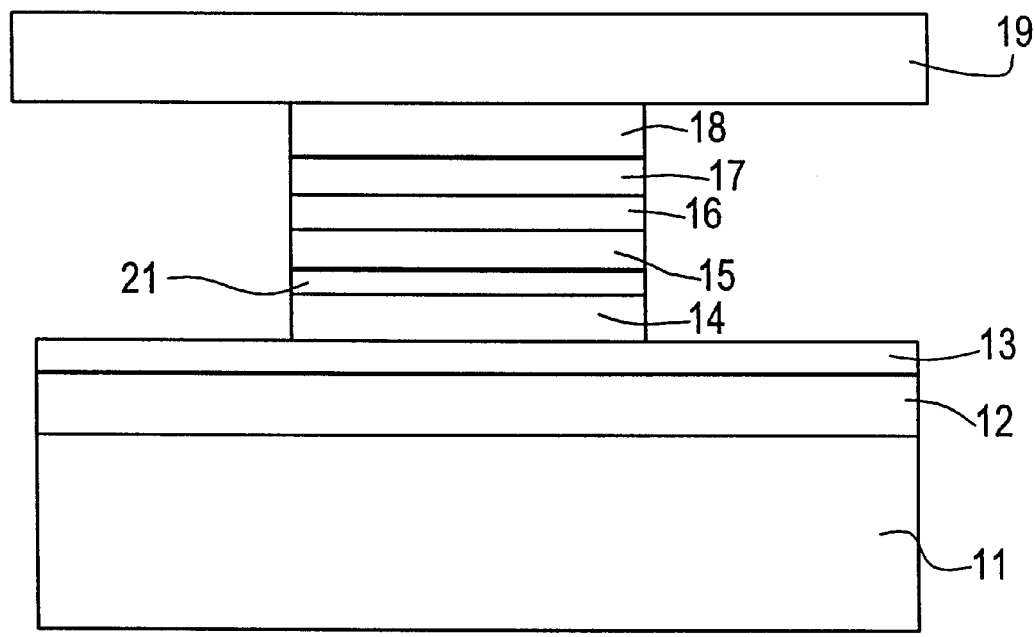
FIG. 2 illustrates an alternative embodiment usable as an external magnetic field sensor.

Referring to FIG. 2, the alternative embodiment is substantially the same as the magnetic tunnel junction device illustrated in FIG. 1 except the provision of an interface layer 21 located between a first antiferromagnetic pinning layer 14 and a ferromagnetic free layer 15.

The material of the interface layer 21 is selected from the group consisting of Al, Ti, V, Cr, Mn, Cu, Zn, Y, Zr, Nb, Mo, Ru, Rh, Pd, Ag, Hf, Ta, W, Re, Pt, Au, Pb, Bi, La, Ce, Pr, Nd, Sm, Eu, Gd, Tb, Dy, Ho, Er, and alloys including at least one of them.

Figure 3:
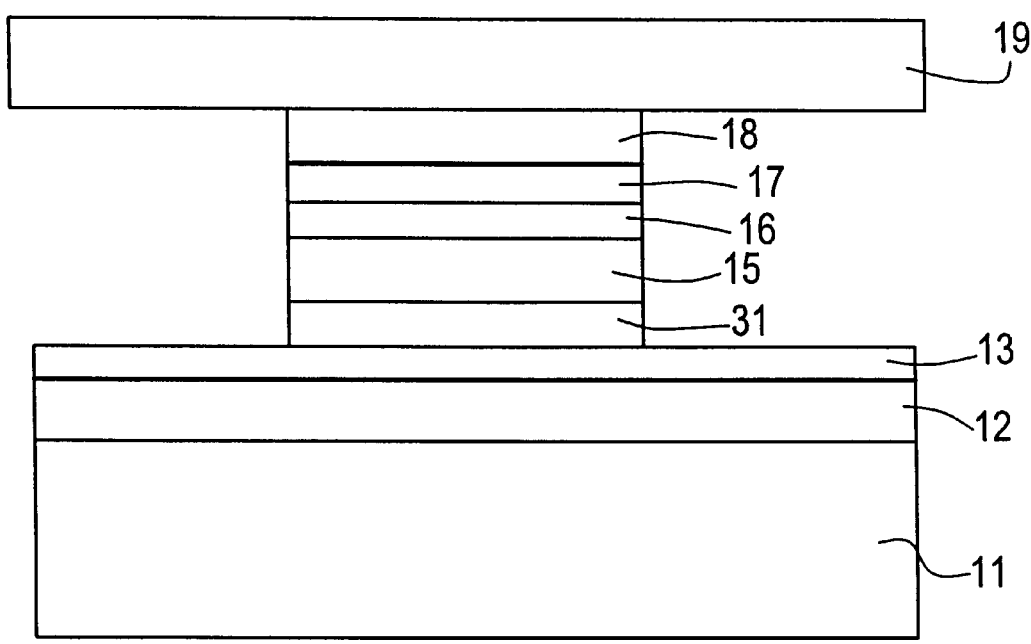
FIG. 3 illustrates a second alternative embodiment usable as an external magnetic field sensor.

Referring to FIG. 3, the second alternative embodiment is substantially the same as the magnetic tunnel junction device illustrated in FIG. 1 except the use of a biasing ferromagnetic pinning layer 31 instead of the first antiferromagnetic pinning layer 14. That is, the biasing ferromagnetic layer is used as the first pinning layer instead of the antiferromagnetic layer.

The biasing ferromagnetic layer is formed of a ferromagnetic layer of CoCrPt, CoPt, and etc.

EXAMPLES

The present invention is described in detail along the following examples.

First Preferred Example

The magnetic tunnel junction devices of FIGS. 1 to 3 are preferred for external field sensing applications. The preferred method for preparing these devices will be described with reference to the process flow diagram of FIGS. 4(a) to 4(f).

Figure 4A:
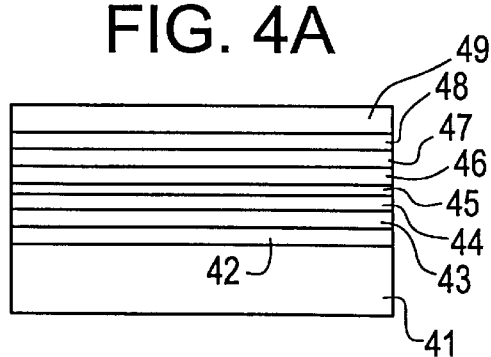
FIGS. 4(a) to 4(f) illustrates process steps in fabricating the device illustrated in FIG. 1.

Referring to FIG. 4(a), a flat silicon substrate wafer covered with thermal oxide is a preferred Si substrate 41. On top of this is grown an Al layer with a thickness of 50 nm to form a bottom electrode 42. A Ta initializing layer 43 with a thickness of 5 nm is deposited on top of the bottom electrode 42.

On top of the initializing layer 43 are deposited a first Fe—Mn antiferromagnetic pinning layer 44 with a thickness of 5 nm, a NiFe ferromagnetic free layer 45 with a thickness of 10 nm, and an Al electrically conducting layer 46 with a thickness of 2 nm. Film growths for preparing these layers are done by dc magnetron sputtering with Ar gas at a gas pressure of 0.3 Pa and a power density of 35 W/cm$^2$.

The Al layer 46 subsequently oxidized at an oxygen pressure falling in a range from 20 mTorr to 200 Torr for 10 minutes to form a tunneling barrier layer 47.

On top of tunneling barrier layer 47 are deposited a CoFe ferromagnetic pinned layer 48 with a thickness of 10 nm and a second NiMn antiferromagnetic pinning layer 49 with a thickness of 30 nm. Film growths for preparing these layers are done by dc magnetron sputtering with Ar gas at a gas pressure of 0.3 Pa and a power density of 35 W/cm$^2$.

Figure 4B:
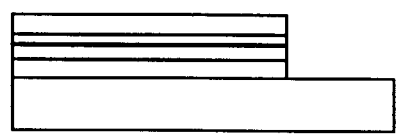
Figure 4C:
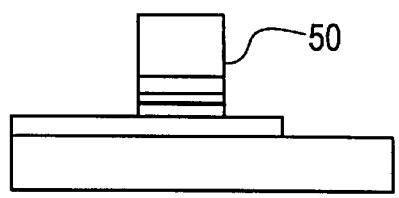
Figure 4D:
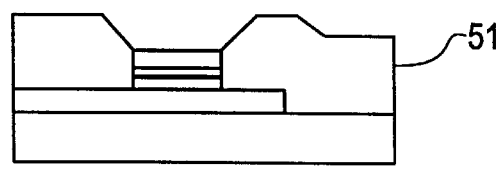
Figure 4E:
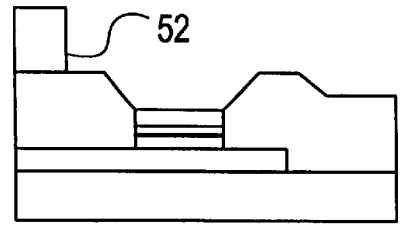
Figure 4F:
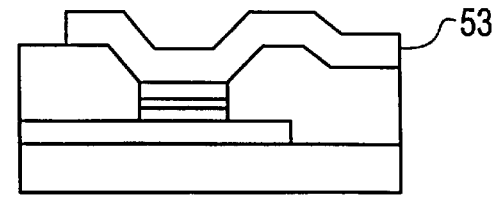
Figure 5:
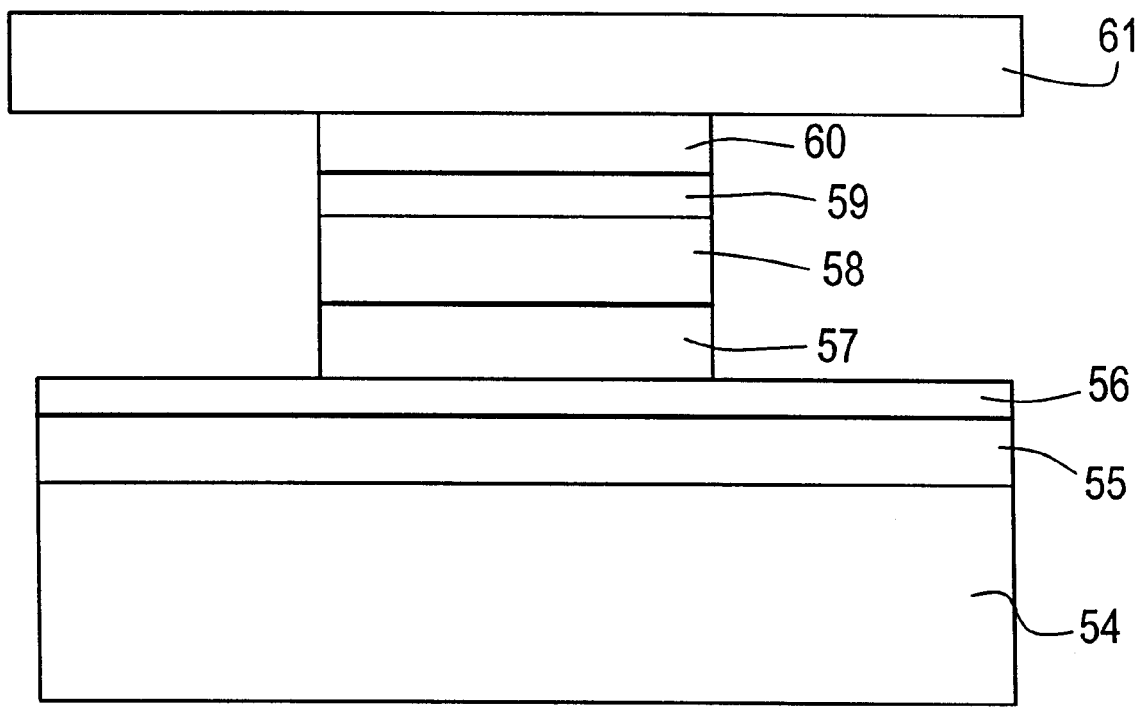
FIG. 5 illustrates the magnetic tunnel junction device previously discussed.

Optical lithography and ion milling are used to define the bottom electrode shapes and pattern the multi-layer stack. FIG. 4(b) shows a cross section of the structure after the milling step is completed. A resist 50 in the pattern of desired top electrode layer is first put on the second antiferromagnetic layer 49. The stack is then thinned by a second ion milling down to the first antiferromagnetic layer 44 in regions not protected by the resist 50. FIG. 4(c) shows the structure cross-section after this second ion milling. With the resist 50 left as a lift-off stencil, an insulating layer 51 of $Al_2O_3$ is put s over the entire patterned structure by energy-enhanced deposition employing electron beam. The thickness of this layer 51 is 300 nm. FIG. 4(d) shows the structure after this resist 50 has been removed upon completion of this deposition. A resist 52 in the pattern of desired top wiring layer is put on the structure as shown in FIG. 4(e). The exposed surface of the second antiferromagnetic layer 49 is cleaned by reverse sputtering to make electrical contact with a wiring layer to be deposited subsequently. A top wiring layer of Al is deposited on top of the structure and the resist 52 is removed to make the desired top wiring layer 53 as shown in FIG. 4(f). The thickness of the wiring layer 53 is 200 nm.

As a magnetization step of the ferromagnetic pinned layer 48, the stack of layers is heated at 270° C. for five (5) hours in a magnetic field in the MR direction of magnitude of 3 KOe. Subsequently, as a magnetization step of the ferromagnetic free layer 45, the stack is heated at 150° C. for one (1) minute in a magnetic field in the track width direction of magnitude of 50 Oe.

The completed magnetic tunnel junction device has demonstrated a MR curve without any hysteresis.

If the magnetization step of the free layer is not conducted, the device has demonstrated a MR curve with large hysteresis. In this case, the external field sensing application of the device is impossible.

Comparative Example

A magnetic tunnel junction device has been fabricated in the same manner as described with reference to the process flow diagram of FIGS. 4(a) to 4(f) except the elimination of the first antiferromagnetic pinning layer 44. The device without the layer 44 has demonstrated a MR curve with large hysteresis. Thus, the external sensing application of this device is impossible.

Second Preferred Example

This second preferred example is substantially the same as the first preferred example except the material and film growth of a first antiferromagnetic pinning layer 44 and the magnetization step of a ferromagnetic free layer 45. According to the second preferred example, the first antiferromagnetic pinning layer of IrMn is deposited by rf sputtering with Ar gas at a gas pressure of 0.3 Pa and a power density of 100 W/cm$^2$. The thickness of this IrMn layer is 15 nm. For magnetization of the free layer, the stack of layers is heated at 250° C. for one minute in a magnetic field in the track width direction of 50 Oe. The completed device has demonstrated a MR curve without any hysteresis.

Third Preferred Example

This third preferred example is substantially the same as the first preferred example except the material and film growth of a first antiferromagnetic pinning layer 44 and the magnetization step of a ferromagnetic free layer 45. According to the third preferred example, the first antiferromagnetic pinning layer of RhMn is deposited by rf sputtering with Ar gas at a gas pressure of 0.3 Pa and a power density of 100 W/Cm². The thickness of this RhMn layer is 5 nm. For magnetization of the free layer, the stack of layers is heated at 200° C. for one minute in a magnetic field in the track width direction of 50 Oe. The completed device has demonstrated a MR curve without any hysteresis.

Fourth Preferred Example

This fourth preferred example is substantially the same as the first preferred example except the material and film growth of a first antiferromagnetic pinning layer 44 and the magnetization step of a ferromagnetic free layer 45. According to the fourth preferred example, the first antiferromagnetic pinning layer of Cr—Al is deposited by rf sputtering with Ar gas at a gas pressure of 0.3 Pa and a power density of 100 W/cm². The thickness of this Cr—Al layer is 20 nm. For magnetization of the free layer, the stack of layers is heated at 220° C. for one minute in a magnetic field in the track width direction of 50 Oe. The completed device has demonstrated a MR curve without any hysteresis.

Fifth Preferred Example

This fifth preferred example is substantially the same as the first preferred example except the material and film growth of a first antiferromagnetic pinning layer 44, the magnetization step of a ferromagnetic free layer 45, and the provision of an interface layer. According to the fifth preferred example, the first antiferromagnetic pinning layer of FeMn is deposited by dc magnetron sputtering with Ar gas at a gas pressure of 0.3 Pa and a power density of 7 W/cm². The thickness of this FeMn layer is 10 nm. The interface layer of Cu is located between the first antiferromagnetic pinning layer and the free layer. For magnetization of the free layer, the stack of layers is heated at 150° C. for one minute in a magnetic field in the track width direction of 50 Oe. The completed device has demonstrated a MR curve without any hysteresis.

The material of the interface layer may be replaced by one selected from the group consisting of Al, Ti, V, Cr, Mn, Zn, Y, Zr, Nb, Mo, Ru, Rh, Pd, Ag, Hf, Ta, W, Re, Pt, Au, Pb, Bi, La, Ce, Pr, Nd, Sm, Eu, Gd, Tb, Dy, Ho, and Er. Each of these alternative devices has demonstrated a RM curve without any hysteresis.

Sixth Preferred Example

This fifth preferred example is substantially the same as the first preferred example except the provision of a biasing ferromagnetic pinning layer instead of the first antiferromagnetic pinning layer 44, the magnetization step of a ferromagnetic free layer 45, and the provision of an interface layer. According to the sixth preferred example, the biasing ferromagnetic pinning layer of CoCrPt is deposited. The thickness of the CoCrPt layer is 10 nm. The interface layer of Ag is located between the biasing ferromagnetic layer and the free layer. The film growth for the Ag interface layer is done by dc magnetron sputtering with Ar gas at a gas pressure of 0.3 Pa and a power density of 10 W/cm². The thickness of this Ag layer is 1.5 nm. For magnetization of the free layer, the stack of layers is heated at 30° C. for one minute in a magnetic field in the track width direction of 3 KOe. The completed device has demonstrated a MR curve without any hysteresis.

While the present invention has been particularly shown and described with reference to the preferred embodiments and examples, it will be understood by those skilled in the art that various changes in form and detail may be made without departing from the sprit and scope of the invention. Accordingly, the disclosed invention is to be considered merely as illustrative and limited in scope only as specified in the appended claims.

What is claimed is:

1. A magnetic tunnel junction device usable as an external magnetic field sensor, comprising:

a first pinning layer, a ferromagnetic free layer, a tunneling barrier layer, a ferromagnetic pinned layer, and a second pinning layer, which are stacked one on top of the other in this order, the first pinning layer having a first pinning field, which pins a magnetization of the free layer in a track width direction the second pinning layer having a second pinning field, which pins a magnetization of the pinned layer in a direction in a plane of the stacked layers, along an applied external magnetic field direction.

2. A magnetic tunnel junction device as claimed in claim 1, wherein the first and second pinning layers comprise antiferromagnetic layers.

3. A magnetic tunnel junction device as claimed in claim 2, further comprising an interface layer located between the first pinning layer and the free layer.

4. A magnetic tunnel junction device as claimed in claim 3, wherein the first pinning layer has a first blocking temperature, and the second pinning layer has a second blocking temperature, the first and second blocking temperatures satisfying the following relation:

$$T_{B1} > 150° C.,$$

$$(T_{B2} - T_{B1}) > 50° C.,$$

where, $T_{B1}$ is the first blocking temperature, and $T_{B2}$ is the second blocking temperature.

5. A magnetic tunnel junction device as claimed in claim 3, wherein the first and second pinning fields has first and second magnitudes, respectively, which satisfy the following relation:

$$Hex1 > 20 \text{ Oe},$$

$$Hex2 > 200 \text{ Oe},$$

where,

Hex1 is the first magnitude, and

Hex2 is the second magnitude.

6. A magnetic tunnel junction device as claimed in claim 3, wherein the material of the interface layer is selected from the group consisting of Al, Ti, V, Cr, Mn, Cu, Zn, Y, Zr, Nb, Mo, Ru, Rh, Pd, Ag, Hf, Ta, W, Re, Pt, Au, Pb, Bi, La, Ce, Pr, Nd, Sm, Eu, Gd, Tb, Dy, Ho, Er, and alloys including at least one of them.

7. A magnetic tunnel junction device as claimed in claim 3, wherein the thickness of the interface layer falls in a range as expressed as:

$$1\ nm \leq t \leq 10\ nm,$$

where, t is the thickness of the interface layer.

8. A magnetic tunnel junction device as claimed in claim 2, wherein the first and second pinning fields have first and second magnitudes, respectively, which satisfy the following relation:

$$Hex1 > 20\ Oe,$$

$$Hex2 > 200\ Oe,$$

where,

Hex1 is the first magnitude, and

Hex2 is the second magnitude.

9. A magnetic tunnel junction device as claimed in claim 2, wherein each of the first and second pinning layers comprises a single layer structure or a double layer structure, and wherein each layer of the structure of the pinning layers comprises a material selected from the group consisting of a Fe—Mn alloy, a Ni—Mn alloy, a Pt—Mn alloy, an Jr—Mn alloy, a Ru—Mn alloy, a Rh—Mn alloy, and a Cr—Al alloy.

10. A magnetic tunnel junction device as claimed in claim 1, is in the form of a biasing ferromagnetic layer.

11. A magnetic tunnel junction device as claimed in claim 10, further comprising an interface layer located between the first pinning layer and the free layer.

12. A magnetic tunnel junction device as claimed in claim 1, wherein each of the ferromagnetic free and pinned layers comprises a material selected from the group consisting of alloys containing at least one of Fe, Co, and Ni.

13. A magnetic tunnel junction device usable as an external magnetic field sensor, comprising:

a first pinning layer, a ferromagnetic free layer, a tunneling barrier layer, a ferromagnetic pinned layer, and a second pinning layer, which are stacked one on top of the other in this order, the first pinning layer having a first pinning field, which pins a magnetization of the free layer in a track width direction, the second pinning layer having a second pinning field, which pins a magnetization of the pinned layer in a direction in a plane of the stacked layers, along an applied external magnetic field direction, wherein the first and second pinning layers comprise antiferromagnetic layers, and the first pinning layer has a first blocking temperature, and the second pinning layer has a second blocking temperature, the first and second blocking temperatures satisfying the following relation:

$$T_{B1} > 150°\ C.,$$

$$(T_{B2} - T_{B1}) > 50°\ C.,$$

where, $TB_{B1}$ is the first blocking temperature, and $TB_{B2}$ is the second blocking temperature.

* * * * *